United States Patent
Peretto et al.

(10) Patent No.: US 10,852,324 B2
(45) Date of Patent: Dec. 1, 2020

(54) CAPACITIVE VOLTAGE-SENSOR ASSEMBLY

(71) Applicant: G & W Electric Company, Bolingbrook, IL (US)

(72) Inventors: Lorenzo Peretto, Rovigo (IT); Alberto Bauer, Dubai (AE)

(73) Assignee: G & W Electric Company, Bolingbrook, IL (US)

( * ) Notice: Subject to any disclaimer, the term of this patent is extended or adjusted under 35 U.S.C. 154(b) by 44 days.

(21) Appl. No.: 16/340,498

(22) PCT Filed: Oct. 12, 2017

(86) PCT No.: PCT/IT2017/000225
§ 371 (c)(1),
(2) Date: Apr. 9, 2019

(87) PCT Pub. No.: WO2018/069949
PCT Pub. Date: Apr. 19, 2018

(65) Prior Publication Data
US 2019/0234995 A1    Aug. 1, 2019

(30) Foreign Application Priority Data

Oct. 14, 2016  (IT) .................. 102016000103234

(51) Int. Cl.
*G01R 15/16*        (2006.01)
(52) U.S. Cl.
CPC ................... *G01R 15/165* (2013.01)
(58) Field of Classification Search
CPC .................................................. G01R 15/165
See application file for complete search history.

(56) References Cited

U.S. PATENT DOCUMENTS

| 6,252,388 B1 | 6/2001 | Jaeger et al. |
| 2011/0121842 A1* | 5/2011 | Bauer .................. G01R 15/165 324/686 |

(Continued)

FOREIGN PATENT DOCUMENTS

| CN | 105588966 A | 5/2018 |
| WO | 2010070693 A | 6/2010 |

OTHER PUBLICATIONS

International Search Report and Written Opinion for International Application No. PCT/IT2018/000037 dated Jul. 17, 2018 (9 pages).

(Continued)

*Primary Examiner* — Clayton E. LaBalle
*Assistant Examiner* — Michael A Harrison
(74) *Attorney, Agent, or Firm* — Michael Best & Friedrich LLP (57) ABSTRACT

A constructive system regarding a capacitance electric voltage sensor comprises a source electrode (110, 210), a shielding tubular body (120, 220), an electric field sensor (130, 230) and a mass of dielectric insulating material (140, 240). The electric field sensor (130, 230) comprises at least one first inner sheet (131, 231) and a second outer sheet (132, 232) superimposed and joined together, wherein said first inner sheet (131, 231) is made by means of a conductive metal material, wherein said second outer sheet (132, 232) is made by means of an electrically insulating material, and wherein said second outer sheet (132, 232) made of insulating material is constrained with respect to the inner face (124, 224) of the shielding tubular element (120, 220).

10 Claims, 6 Drawing Sheets

(56) References Cited

U.S. PATENT DOCUMENTS

| | | | |
|---|---|---|---|
| 2011/0205683 A1* | 8/2011 | Peretto | G01R 29/12 |
| | | | 361/281 |
| 2011/0298454 A1* | 12/2011 | Ausserlechner | G01R 19/00 |
| | | | 324/252 |
| 2016/0005511 A1 | 1/2016 | Gravermann et al. | |
| 2016/0245845 A1 | 8/2016 | Alberto | |
| 2017/0038414 A1 | 2/2017 | Barba Jimenez | |

OTHER PUBLICATIONS

International Search Report and Written Opinion for International Application No. PCT/IT2017/000225 dated Apr. 5, 2018 (11 pages).

* cited by examiner

CAPACITIVE VOLTAGE-SENSOR ASSEMBLY

CROSS REFERENCE TO RELATED APPLICATIONS

This application is the US-national stage of PCT application PCT/IT2017/000225 filed 12 Oct. 2017 and claiming the priority of Italian patent application 102016000103234 itself filed 14 Oct. 2016.

FIELD OF THE INVENTION

The present invention relates to a constructive system comprising a capacitive voltage sensor, wherein said sensor detects the electric field generated by a voltage element of the same capacitive sensor, for example, to determine the voltage value of said live element.

More particularly, the present invention relates to a constructive system comprising a capacitive voltage sensor, in which said sensor detects the electric field generated by a voltage element of the same sensor without affecting any surrounding electric and/or magnetic fields, such as, for example, the electromagnetic fields generated by other conductors and/or other nearby bars.

BACKGROUND OF THE INVENTION

At the present the known capacitive voltage sensors have a number of drawbacks.

A first drawback is due to the fact that the resin of dielectric material disposed around the sensor components includes vacuoles (air bubbles) with consequent phenomena of unwanted partial discharges.

Another disadvantage is due to the fact that the same resin is detached from the elements that make up the capacitive sensor with consequent phenomena of unwanted partial discharges.

A third drawback is due to the fact that said resin is not perfectly adherent and/or not perfectly clamped and/or constrained with respect to the organs constituting the capacitive sensor and, therefore, as a result of aging, there are discontinuities between said resin and the organs quoted, with consequent phenomena of unwanted partial discharges. This disadvantage is particularly present when the capacitive sensor is used in an environment where the operating temperature (hot/cold) varies cyclically.

With reference to the facts of the invention, the following documents are cited: WO_2010/070.693.A1, CN_105.588.966.A and U.S. Pat. No. 6,252,388.B1.

Exposure of the Invention

It is therefore the object of the present invention to solve the aforementioned drawbacks.

The invention, which is characterized by the claims, solves the problem of creating a constructive system regarding a capacitive sensor of electric voltage, in which said capacitive sensor extends axially along an axis defined longitudinal, in which said capacitive sensor comprises: >_a source electrode, _in which said source electrode has an elongated shape that extends longitudinally along a longitudinal axis, in which said source electrode configures a first axial end portion and a second axial end portion opposite to the first axial end portion; >_a tubular body shielding, _in which said tubular body shielding has an elongated shape which extends longitudinally along a longitudinal axis, in which said tubular body shielding configures a first axial portion and a second axial portion opposite to said first axial portion, in which said tubular body shielding configures a shell having an inner face and an outer face; >_an electric field sensor, _in which said electric field sensor is positioned radially spaced around said source electrode, _in which said electric field sensor is positioned within said tubular body shielding, _in which said electric field sensor is positioned between the first axial end portion and the second axial end portion; >_a mass of dielectric insulating material, in which said mass is able to encompass said tubular body shielding, said source electrode and said electric field sensor; in which said constructive system is characterized by the fact that said electric field sensor comprises at least a first inner sheet and a second outer sheet overlapped and joined together; by the fact that said first inner sheet is made by an electrically conductive material; by the fact that said second outer sheet is made by an electrically insulating material; by the fact that said second outer sheet made by insulating material is constrained with respect to the inner face of the tubular shielding.

BRIEF DESCRIPTION OF THE DRAWINGS

Further features and advantages of the present invention will be more evident from the following description of some of its preferred embodiments, here given merely by way of non-limiting example, with reference to the accompanying drawings in which:

FIGS. 3, 4 and 5 illustrate in schematic manner and as planarly view a possible and preferred embodiment of a structure for forming an electric field sensor prior to its insertion into a shielding tubular body, in which FIG. 4 is a cross-sectional view with respect to the line 4-4 of FIG. 3;

EXEMPLIFYING DESCRIPTION OF SOME PREFERRED EMBODIMENTS

With reference to the accompanying drawings, the constructive system object of the present invention is able to provide a capacitive electrical voltage sensor, wherein said sensor extends along an axis Y defined longitudinal.

Figure 1:
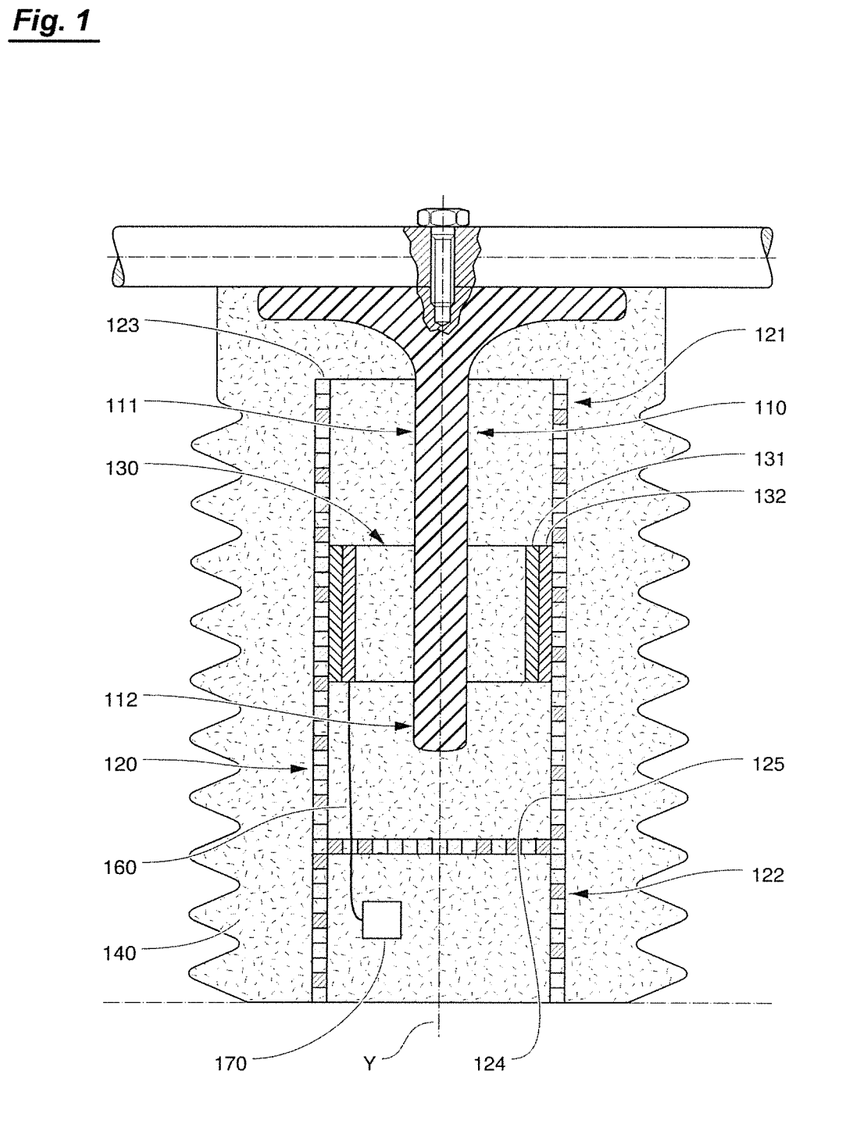
FIG. 1 illustrates a first embodiment of the constructive system object of the present invention, wherein said system is used to produce a capacitive voltage sensor.
Figure 2:
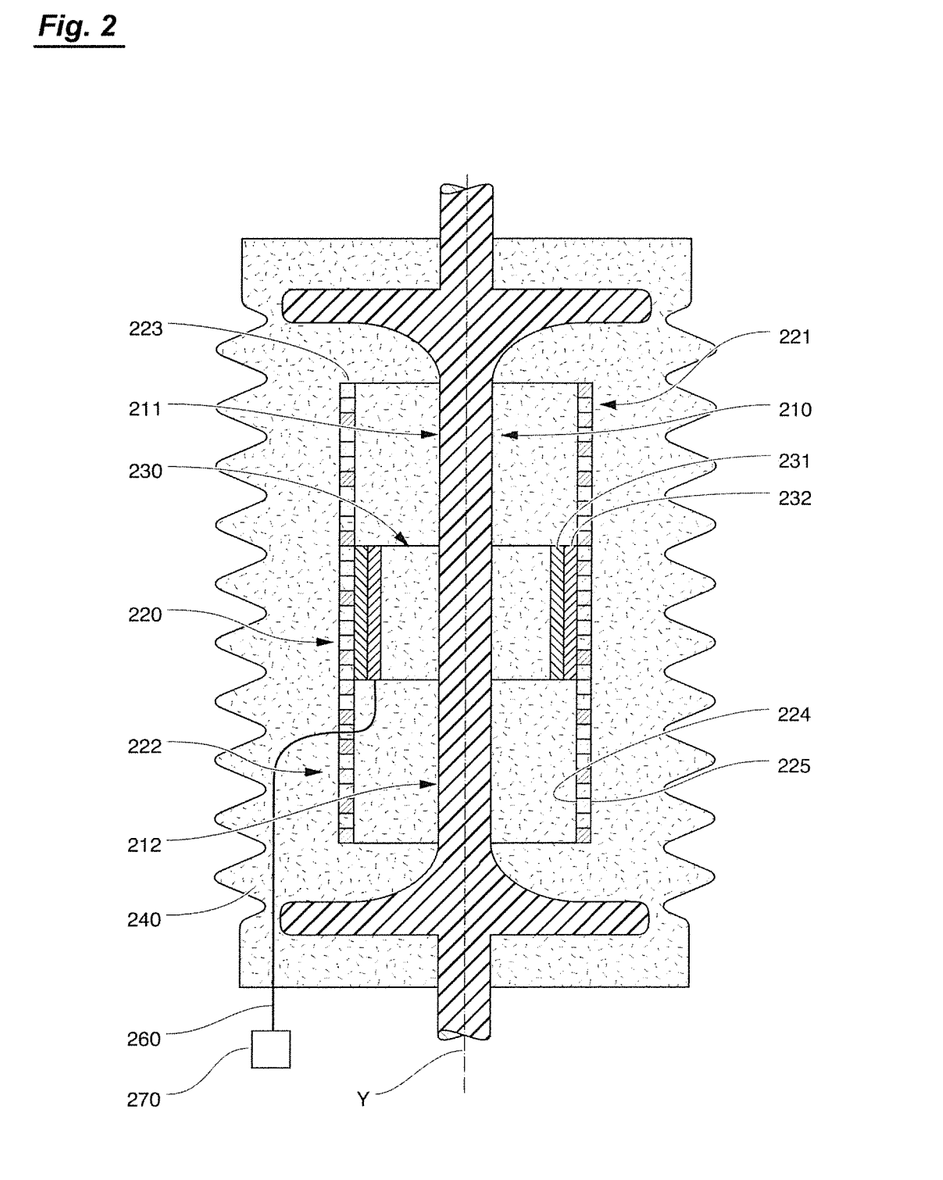
FIG. 2 illustrates a second embodiment of the constructive system object of the present invention, wherein said system is used to make a feedthrough able to also perform the function of capacitive voltage sensor.

With reference to FIGS. 1 and 2, this system substantially comprises a source electrode 110/210, a shielding tubular body 120/220, an electric field sensor 130/230, and a mass of dielectric insulating material 140/240.

With reference to said source electrode 110/210 it has an elongated shape extending longitudinally along a longitudinal axis Y, in such a way as to configure a first axial end portion 111/211 and a second opposite axial end portion 112/212, in which the latter is opposite with respect to the first axial end portion 111/211.

With reference to the shielding tubular body 120/220, it has an elongate shape extending longitudinally along a longitudinal axis Y, so as to configure a first axial end portion 121/221 and a second opposite axial end portion 122/222.

The shielding tubular body 120/220 is preferably grounded and it is able to shield the electric field sensor 130/230 with respect to the field lines generated by live voltage conductors positioned externally with respect to the capacitive sensor, so that the field sensor 130/230 detects the field lines generated by the source electrode 110/210.

Said shielding tubular body 120/220 comprises a tubular mantle 123/223, wherein said mantle 123/223, configures an inner face 124/224 and an outer face 125/225 with respect to the central axis Y.

With reference to the electric field sensor 130/230, said electric field sensor 130/230 is radially spaced with respect and around said source electrode 110/210 as well as positioned within said shielding tubular body 120/220 and preferably positioned in a intermediate point comprised between the first axial end portion 121/221 and the second axial end portion 122/222 of said screening tubular body 120/220.

With reference to the mass of dielectric insulating material 140/240, said mass is able to incorporate the various elements of the sensor and, primarily and substantially, said shielding tubular body 130/230, said source electrode 110/210 and said electric field sensor 130/230, in order to positioning said elements and in order to form an electrically insulated carrier structure.

Also referring to FIGS. 3, 4, 5 and 6, said electric field sensor 130/230 comprises at least one first inner sheet 131/231 and a second external sheet 132/232 which are superimposed and joined together, preferably as a monolithic structure, as best described below, wherein the first inner sheet 131/231 is made by means of an electrically conductive material (metallic) and the second external sheet 132/232 is made by means of an electrically insulating material.

Figure 3:
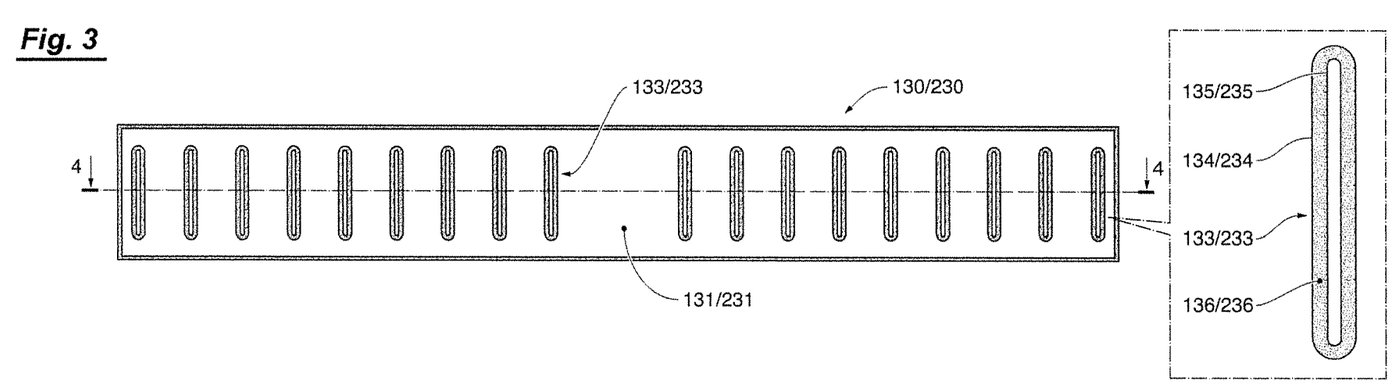
Figure 4:
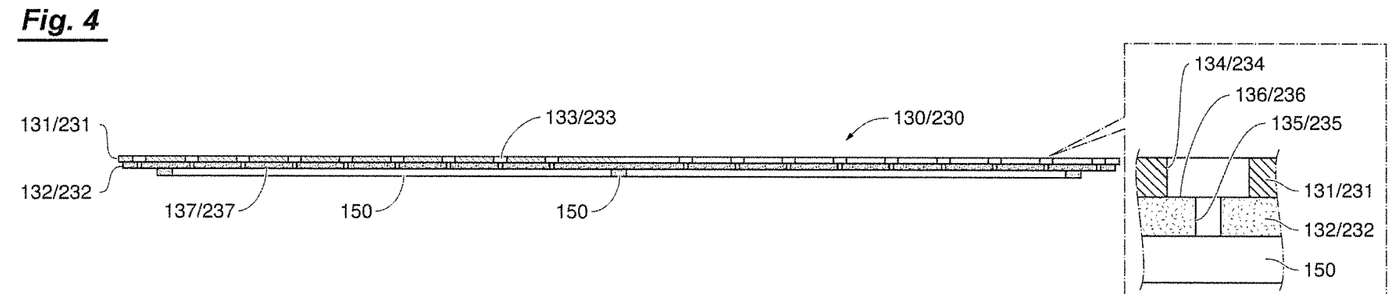
Figure 5:
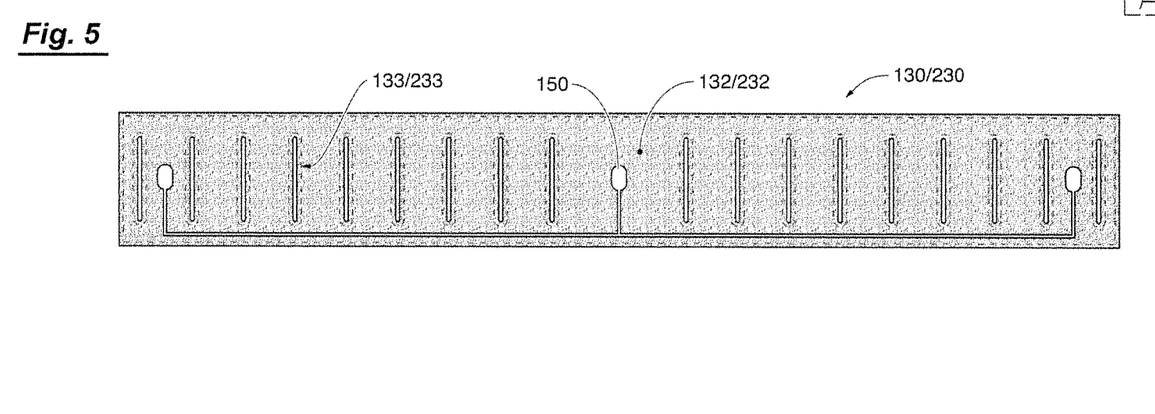

With reference to the second outer sheet 132/232 made by insulating material it is preferably bonded to the inner face 124/224 of the shielding element 120/220, for example, by glue points positioned on the outer face of the sheet 132/232 and on the internal face 124/224 of the shielding tubular body 120/220, or by other systems as described below.

With reference to the first internal sheet 131/231 made by conductive material, it is able to detect the electric field lines generated by the source electrode 110/210 and, more particularly, it is intended to form a capacitive coupling between said source electrode 110/210 and said first sheet 131/231.

In this context, said first sheet 131/231 may take various forms and/or dimensions and/or sizes which can be different with respect to those illustrated in the figures, without departing from the inventive concept of the present invention.

With reference to the second outer sheet 132/232 made by insulating material, it is able to support the inner sheet 131/231 in place, as well as able to electrically insulating the inner sheet 131/231 with respect to the shielding tubular body 120/220 and therefore, said second sheet 132/232 may take shapes and/or thickness and/or size and/or conformations different with respect of those illustrated in the Figures without departing from the inventive concept of the present invention.

Figure 1A:
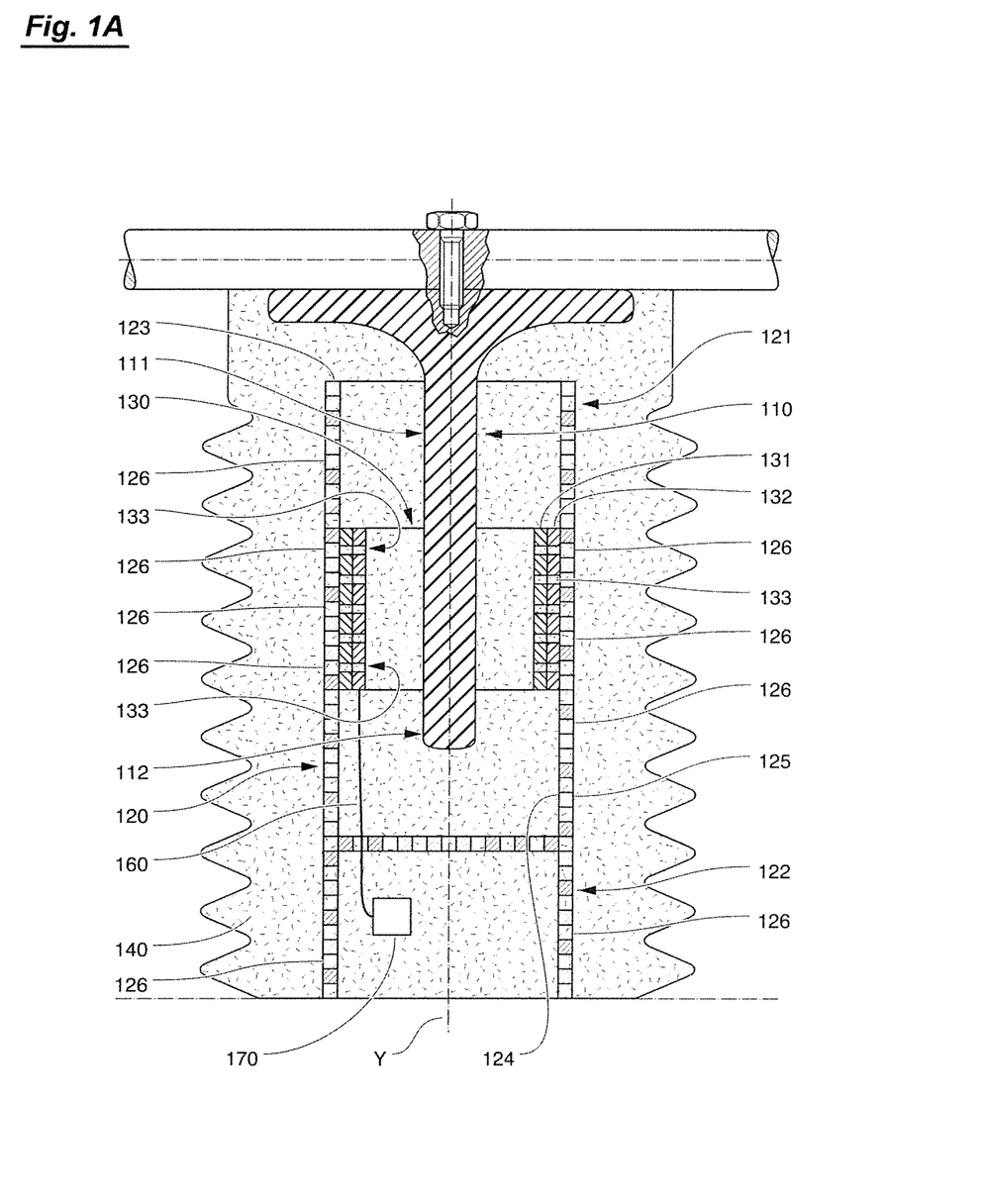
FIG. 1A illustrates a constructive variation of the system of the first embodiment of FIG. 1.
Figure 2A:
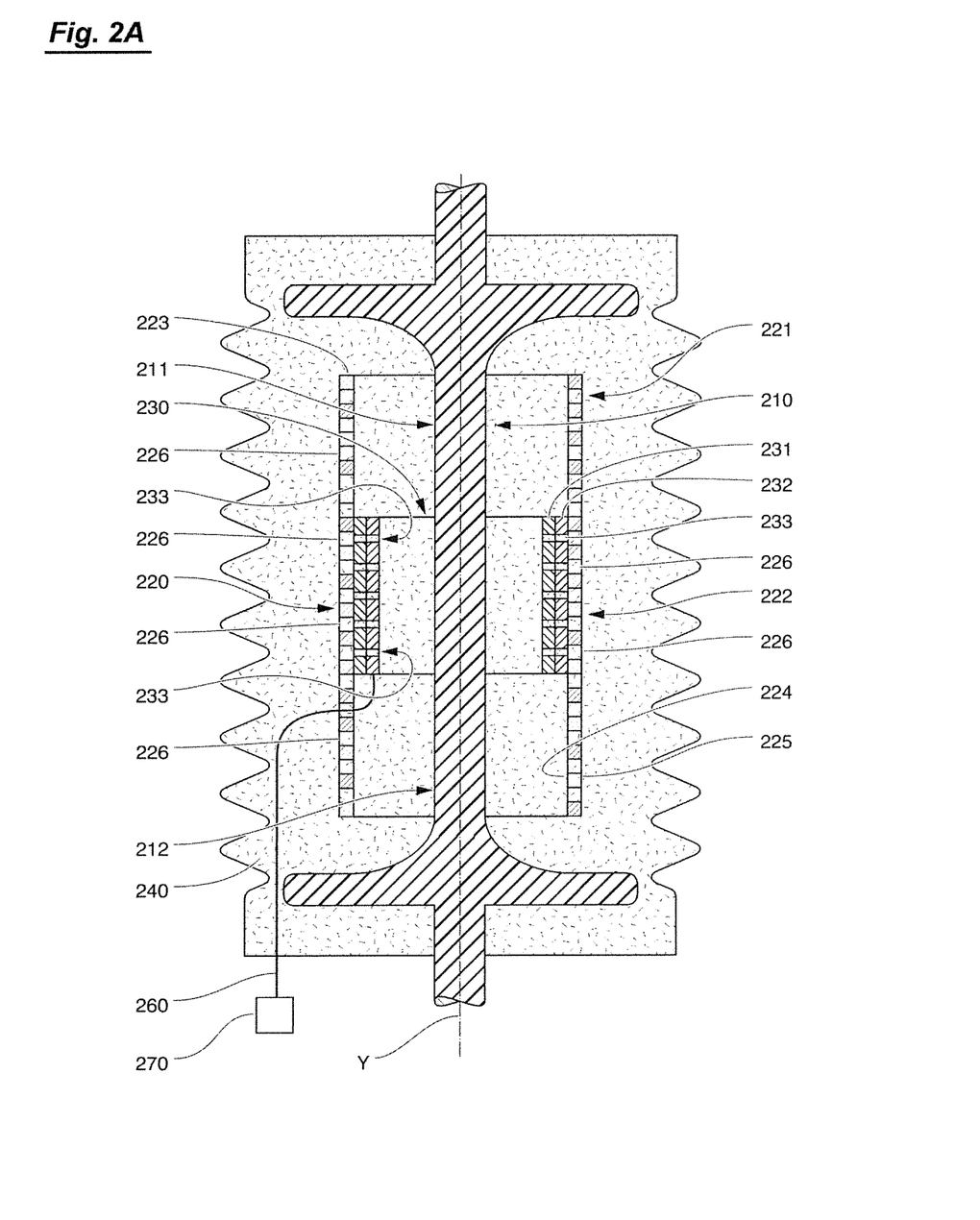
FIG. 2A illustrates a constructive variation of the system that relates to the second embodiment of FIG. 2.
Figure 6:
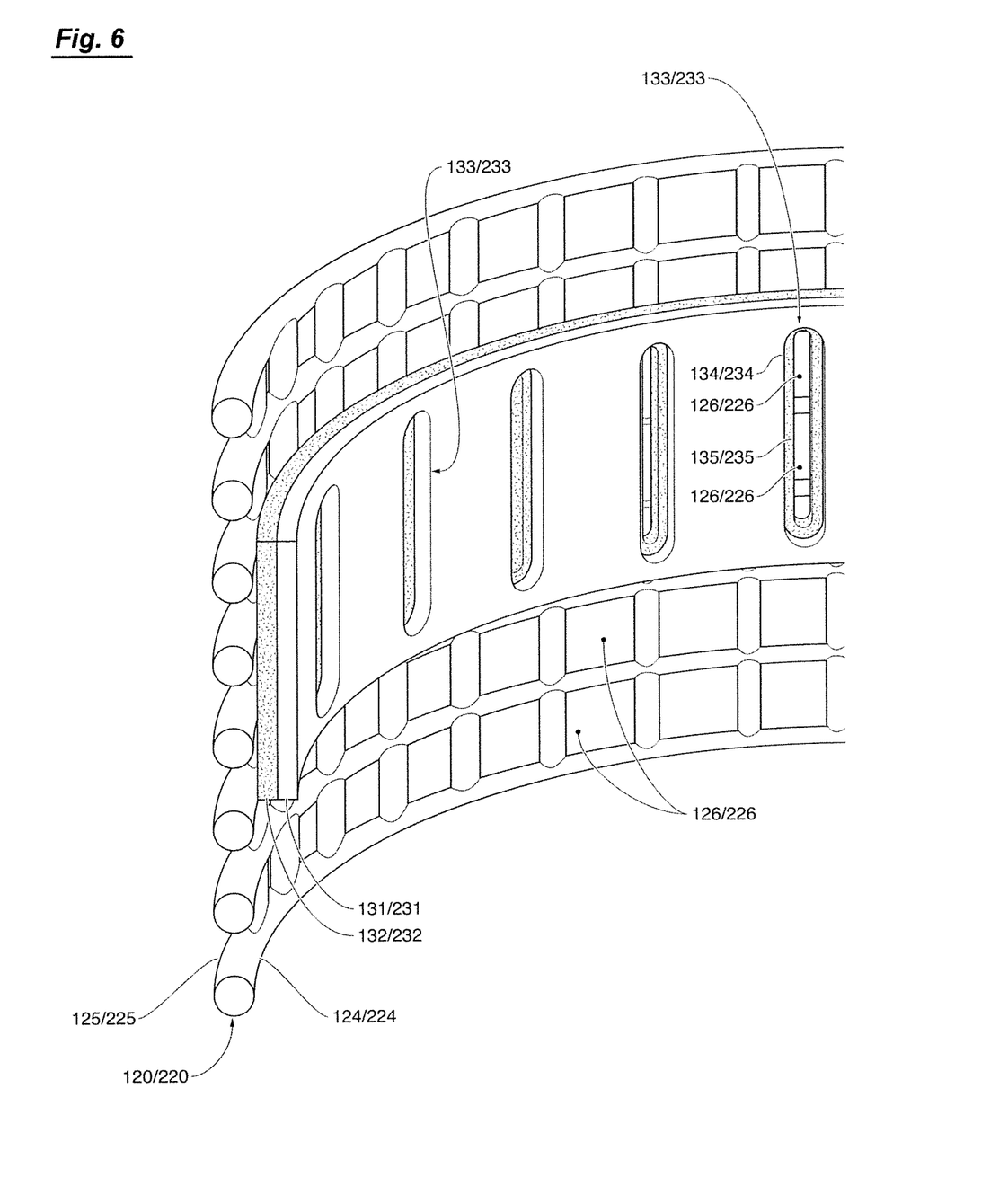
FIG. 6 illustrates schematically a constructive detail regarding the constructive variants of FIGS. 1A and 2A.

With particular reference to FIGS. 1A, 2A and 6, the shielding tubular body 120/220 is provided with first through holes 126/226, wherein said first through holes 126/226 have a width such that the resin can pass through the same first through holes 126/226 during the casting of the same resin while forming the sensor.

With reference to FIGS. 3, 4 and 5, said electric field sensor 130/230 is provided with second through holes 133/233, wherein said second through holes 133/233 have a width able to allow the passage of the resin through the same second holes 133/233 during its casting for forming the sensor.

With particular reference to FIG. 6, said first through holes 126/226 and said second through holes 133/233 are axially and mutually communicating, preferably axially aligned with each other, and in any case disposed in such a way as to allow the passage of the resin through said first 126/226 and said second 133/233 through holes during the casting of the same resin while forming the sensor.

With reference to FIG. 5, said electric field sensor may further comprise optional fixing means 150, which are applied to the external face 1331233 of the second outer sheet 132/232, wherein said fixing means 150 are designed to form a bond between the second sheet 132/232 and the inner face 124/224 of the shielding tubular body 120/220.

If the fixing means 150 are not present, the electric field sensor comprises only the inner sheet 131/231 and the external sheet 132/232, associated with them, provided with through holes 133/233, and in this case it is provided to fix the outer foil 132/232 with respect to and/or against the inner face 124/224 of the shielding tubular body 120/220 by points of glue or other systems.

With particular reference to FIGS. 3, 4 and 5, they illustrate in detail a particular electric field sensor 130/230, wherein said first inner sheet 131/231 is provided with respective through holes defined by a respective perimeter 134/234, said second outer sheet 132/232 is provided with respective through holes defined by a respective perimeter 135/235, wherein said through holes in said first inner sheet 131/231 have a greater amplitude than the through holes in the second outer sheet 132/232, in such a way as to create between said two perimeters 134_135/234_235 (i.e., between said two through holes) an annulus 136/236 of insulating material.

With reference to FIGS. 1 and 2, the capacitive coupling between the source electrode 110/210 and the electric field sensor 130/230 detects the electric field generated by the source electrode 110/210, and the relative signal by the cable 160/260 can be transmitted to a processing device 170/270, for example to estimate the value of the voltage present in said source electrode 110/210.

With reference to the above description, as the electric field sensor 130/230 is formed by a monolithic body comprising at least one first internal sheet 131/231 and a second external sheet 132/232 overlapped and joined together (glued, associated, bound) before of the their insertion into the shielding tubular body 120/220, there is no undesirable delamination dislocation/separation between said two sheets, thus solving the above-mentioned problems as well as solving other problems associated with the assembling of the sensor components before the casting, as the electric filed sensor 130/230 is easily and quickly secured/fixed in position by means of points of glue between the external face 137/237 of the external sheet 132/232 of the electric field sensor 130/230 and the internal face 124/224 of the shielding tubular body 120/220.

With reference to the particular embodiment of FIG. 6, the resin can pass and flow through the holes 133/233 executed in the two sheets 131/231 and 132/232 of the electric field sensor 130/230 during its casting, and some resin can also and flow through the holes 126/226 of the screening tubular body 120/220, and in this manner the characteristics of filling and of gripping of the resin are improved, no undesired vacuoles are formed, and no undesired dislocation/separation shall occur between the shielding body 120/220 and the electric field sensor 130/230, thus solving the above-mentioned problems.

The description of the various embodiments of the constructive system for a capacitive sensor are provided solely by ways of non-limiting example, and clearly, therefore, said system can be modified or varied in any way suggested by experience and/or by its use or application within the scope of the following claims. _The following claims also form an integrative part of the above description.

The invention claimed is:

1. A capacitive voltage sensor comprising:
   an elongated source electrode extending along a longitudinal axis and having first and second axially opposite electrode ends;
   a tubular shield surrounding the electrode and having
     a first axial portion,
     a second axial portion spaced axially from the first portion,
     an inner surface spaced radially outward from the electrode, and
     an outer surface;
   a tubular electric field sensor inside the tubular shield, between the first and second portions thereof, spaced radially outward from the source electrode, and formed by a first inner layer of electrically conductive material spaced radially outward from the source electrode and a second outer layer of electrically insulating material bonded to and covering the first layer and fixed to the inner surface of the tubular shield; and
   a mass of dielectric insulating material surrounding the tubular shield and filling the tubular shield between the inner surface thereof and the source electrode, thereby embedding the field sensor.

2. The capacitive voltage sensor defined in claim 1, wherein the second layer electrically isolates the first layer from the tubular shield.

3. The capacitive voltage sensor defined in claim 1, wherein the electric field sensor is a monolithic body.

4. The capacitive voltage sensor defined in claim 3, wherein the body is flexible.

5. The capacitive voltage sensor defined in claim 1, is formed as a printed circuit board.

6. The capacitive voltage sensor defined in claim 1 wherein the tubular shield is formed with a plurality of radially throughgoing holes through which the electrically insulating material of the mass extends.

7. The capacitive voltage sensor defined in claim 6, wherein the electrical field sensor is formed with a plurality of radially throughgoing holes through which the insulating material of the mass extends.

8. The capacitive voltage sensor defined in claim 7, wherein the holes of the electrical field sensor are aligned with the holes of the tubular shield.

9. The capacitive voltage sensor defined in claim 8, wherein the holes of the electrical field sensor each have an outer portion in the outer layer and an inner portion in the inner layer and the inner portions of the holes are of larger cross-sectional size than the outer portions.

10. The capacitive voltage sensor defined in claim 1, further comprising:
    a fastener mounted on an outer surface of the outer layer.

* * * * *